(12) United States Patent
Kosel et al.

(10) Patent No.: US 11,736,042 B2
(45) Date of Patent: Aug. 22, 2023

(54) ENERGY PRODUCING DEVICE WITH A PIEZOELECTRIC ENERGY GENERATING BEAM

(71) Applicant: KING ABDULLAH UNIVERSITY OF SCIENCE AND TECHNOLOGY, Thuwal (SA)

(72) Inventors: Jürgen Kosel, Thuwal (SA); Mohammed Asadullah Khan, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 393 days.

(21) Appl. No.: 17/043,181

(22) PCT Filed: Apr. 2, 2019

(86) PCT No.: PCT/IB2019/052700
§ 371 (c)(1),
(2) Date: Sep. 29, 2020

(87) PCT Pub. No.: WO2019/197942
PCT Pub. Date: Oct. 17, 2019

(65) Prior Publication Data
US 2021/0143758 A1    May 13, 2021

Related U.S. Application Data

(60) Provisional application No. 62/654,690, filed on Apr. 9, 2018.

(51) Int. Cl.
*H02N 2/18* (2006.01)
*H02N 2/00* (2006.01)
(Continued)

(52) U.S. Cl.
CPC .............. *H02N 2/186* (2013.01); *H02N 2/22* (2013.01); *H10N 30/06* (2023.02);
(Continued)

(58) Field of Classification Search
CPC ... H02N 2/186; H01L 41/053; H01L 41/1136; H01L 41/193
See application file for complete search history.

(56) References Cited

U.S. PATENT DOCUMENTS 8,901,802 B1 * 12/2014 Que ...................... H02N 2/186
310/330
2009/0261689 A1 * 10/2009 Fang ...................... H02K 53/00
310/329

(Continued)

FOREIGN PATENT DOCUMENTS

WO    2008116173 A1    9/2008
WO    2014076458 A1    5/2014

OTHER PUBLICATIONS

NPL Engineering Toolbox (Year: 2010).*
(Continued)

*Primary Examiner* — Bryan P Gordon
(74) *Attorney, Agent, or Firm* — Patent Portfolio Builders PLLC

(57) ABSTRACT

An energy producing device includes a piezoelectric layer having a first side and second side opposite of the first side, a first electrical contact arranged on the first side of the piezoelectric layer, a second electrical contact arranged on the second side of the piezoelectric layer, and a counter-layer arranged on the second electrical contact. The piezoelectric layer, first and second electrical contacts, and counter-layer form a beam having a neutral axis outside of the piezoelectric layer.

19 Claims, 5 Drawing Sheets

(51) Int. Cl.
*H10N 30/06* (2023.01)
*H10N 30/072* (2023.01)
*H10N 30/88* (2023.01)
*H10N 30/30* (2023.01)
*H10N 30/857* (2023.01)

(52) U.S. Cl.
CPC ......... *H10N 30/072* (2023.02); *H10N 30/306* (2023.02); *H10N 30/857* (2023.02); *H10N 30/88* (2023.02)

(56) References Cited

U.S. PATENT DOCUMENTS

| | | | |
|---|---|---|---|
| 2010/0072759 A1* | 3/2010 | Andosca | H02N 2/188 290/1 R |
| 2010/0181871 A1* | 7/2010 | Daniel | H10N 30/306 73/579 |
| 2013/0002095 A1 | 1/2013 | Linden | |
| 2016/0322559 A1* | 11/2016 | Fuentes-Fernandez | H10N 30/082 |
| 2016/0365501 A1* | 12/2016 | Kang | H10N 30/30 |

OTHER PUBLICATIONS

International Search Report in corresponding/related International Application No. PCT/IB2019/052700, dated Jul. 24, 2019.
Written Opinion of the International Searching Authority in corresponding/related International Application No. PCT/B2019/052700, dated Jul. 24, 2019.

* cited by examiner

ENERGY PRODUCING DEVICE WITH A PIEZOELECTRIC ENERGY GENERATING BEAM

CROSS-REFERENCE TO RELATED APPLICATIONS

This application is a U.S. National Stage Application of International Application No. PCT/IB2019/052700, filed on Apr. 2, 2019, which claims priority to U.S. Provisional Patent Application No. 62/654,690, filed on Apr. 9, 2018, entitled "METHOD FOR ENHANCING THE OUTPUT OF PIEZOELECTRIC BEAM DEVICES," the disclosures of which are incorporated herein by reference in their entirety.

BACKGROUND

Technical Field

Embodiments of the subject matter disclosed herein generally relate to an energy producing device with a piezoelectric energy generating beam having a neutral axis outside of the piezoelectric layer of the beam.

Discussion of the Background

Piezoelectric beams are often used in miniature transducers. In its most simple form, a piezoelectric beam consists of a cantilever comprising piezoelectric material, which when strained along its length, produces charges, and in turn a potential difference across the two sides of the piezoelectric material due to the piezoelectric effect. The amount of generated charges (i.e., the potential difference) produced is proportional to the applied strain, i.e., the larger the strain the more charges are generated. The effect is typically directionally dependent so that a positive strain caused by tension causes the opposite effect compared to a negative strain caused by compression.

FIGS. 1A-10 illustrate a conventional piezoelectric beam consisting of a single layer of piezoelectric material. As illustrated in FIG. 1A, the single layered piezoelectric beam 105 has a neutral axis 110 running through the middle of the single layer. As illustrated in FIG. 1B, when the piezoelectric beam 105 is arranged as a cantilever beam and is bent, a portion 105A of the piezoelectric beam on one side of the neutral axis 110 will be subject to positive strain (i.e., tension T) and the portion 105B of the piezoelectric beam 105 on the other side of the neutral axis 110 will be subject to a negative strain (i.e., compression C), which essentially cancels out any energy produced by the piezoelectric beam 105. Specifically, referring now to FIG. 10, the positive strain (T) on the portion 105A and the negative strain on the portion 105B result in the internal dipoles of the piezoelectric material aligning in opposite directions on either side of the neutral axis 110. This opposed alignment of dipoles results in zero voltage produced in the piezoelectric material with a perfectly linear response. Oftentimes, however, non-linearities, i.e., a larger response to either of the two strains, is exhibited and thus a small voltage is produced. Accordingly, when the neutral axis 110 is located near the middle of the piezoelectric beam 105 the efficiency of transduction is dramatically reduced.

Thus, there is a need for a piezoelectric energy generating beam having a neutral axis that is outside of the piezoelectric layer of the beam so that the internal dipoles of the piezoelectric layer do not largely cancel each other out, as well as an energy producing device comprising such a piezoelectric energy generating beam.

SUMMARY

According to an embodiment, there is an energy producing device includes a piezoelectric layer having a first side and second side opposite of the first side, a first electrical contact arranged on the first side of the piezoelectric layer, a second electrical contact arranged on the second side of the piezoelectric layer, and a counter-layer arranged on the second electrical contact. The piezoelectric layer, first and second electrical contacts, and counter-layer form a beam having a neutral axis outside of the piezoelectric layer.

According to another embodiment, there is a method for forming an energy producing device. A first electrical contact is formed on a first side of a piezoelectric layer. A second electrical contact is formed on a second side of the piezoelectric layer. The second side of the piezoelectric layer is opposite of the first side. A counter-layer is laminated to the second electrical contact. The piezoelectric layer, first and second electrical contacts, and counter-layer form a beam having a neutral axis outside of the piezoelectric layer.

According to a further embodiment, there is a method for forming an energy producing device. A desired neutral axis of a beam comprising a piezoelectric layer on top of a counter-layer is determined. The desired neutral axis is at or below an interface between the piezoelectric layer and the counter-layer. A material for the counter-layer and a thickness of the material for the counter-layer are selected to achieve the desired neutral axis. The energy producing device comprising the beam with a counter-layer comprising the selected material and thickness is formed. The beam of the energy producing device has the desired neutral axis.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 1B and 10 are schematic diagrams of conventional piezoelectric cantilever beams;

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of piezoelectric energy generating beam.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
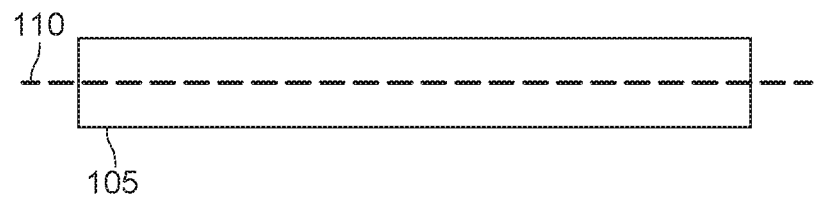
FIG. 1A is a schematic diagram of a conventional piezoelectric beam.
Figure 1B:
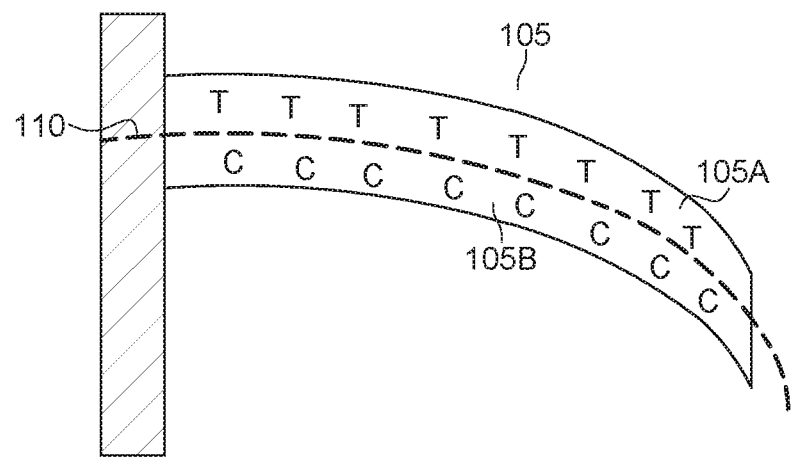
Figure 1C:
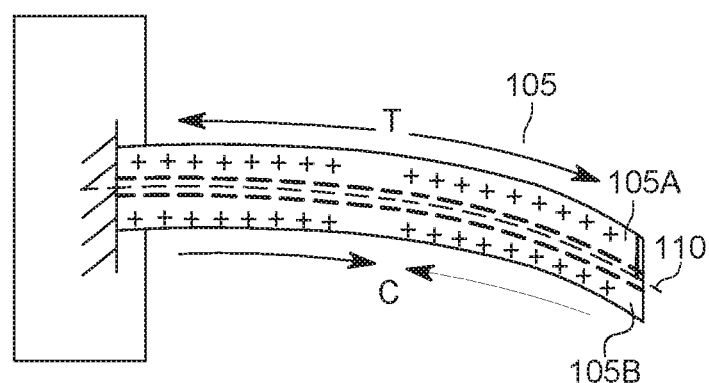
Figure 2A:
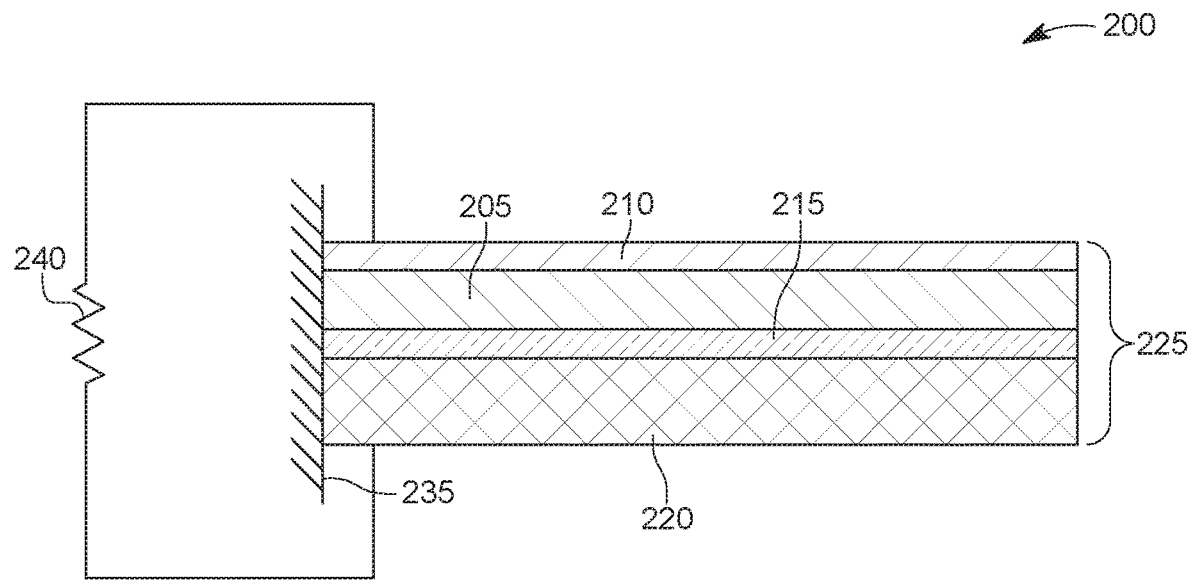
FIG. 2A is a schematic diagram of an energy producing device according to embodiments.

FIG. 2A is a schematic diagram of an energy producing device according to embodiments. The energy producing device 200 includes a piezoelectric layer 205 having a first side and second side opposite of the first side. A first electrical contact 210 is arranged on the first side of the piezoelectric layer 205. A second electrical contact 215 is arranged on the second side of the piezoelectric layer 205. A counter-layer 220 is arranged on the second electrical contact 215. The piezoelectric layer 205, first 210 and second 215 electrical contacts, and counter-layer 220 form a beam 225 having a neutral axis 230 outside of the piezoelectric layer 205.

Figure 2B:
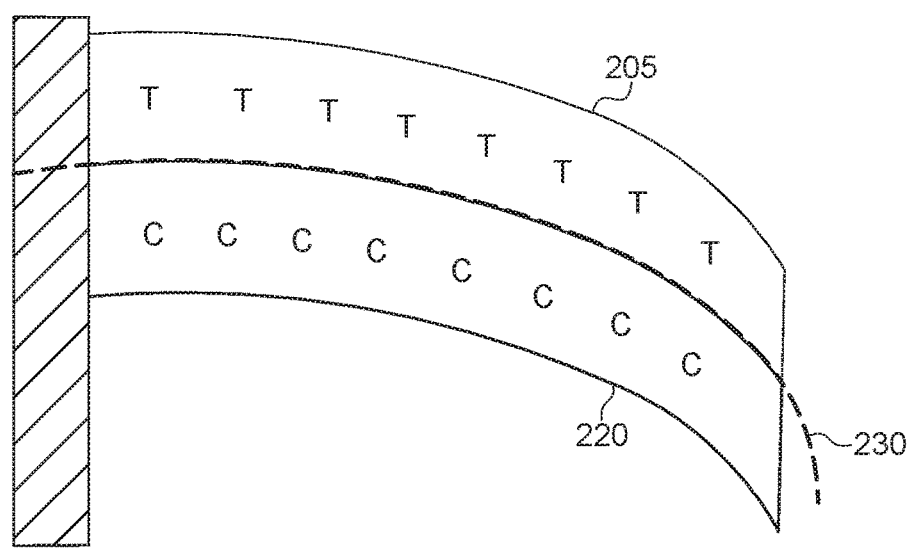
FIG. 2B is a schematic diagram of the strain on a beam of an energy producing device according to embodiments.

The neutral axis being outside of the piezoelectric layer can be appreciated from FIG. 2B. Specifically, in the illustrated embodiment the neutral axis 230 is arranged at the interface between the piezoelectric layer 205 and the counter-layer 220 (the intervening electrical contact 215, which is at this interface, is omitted for sake of clarity). Thus, bending of the beam 225 results in positive strain (i.e., tension T) in the piezoelectric layer 205 and negative strain (i.e., compression C) in the counter-layer 220. It should be recognized that the beam 225 can also be arranged to bend in the opposite direction so that the piezoelectric layer 205 exhibits negative strain and the counter-layer 220 exhibits positive strain. Further, as discussed in more detail below, the advantages achieved by using the counter-layer 220 is to move the neutral axis of the beam outside of the piezoelectric layer 205 and as the neutral axis is moved further away from the piezoelectric layer 205, including into the counter-layer 220, the voltage output of the piezoelectric layer 205 increases.

In an embodiment, the piezoelectric layer 205 comprises, for example, polyvinylidene fluoride (PVDF) and the counter-layer 220 comprises, for example, poly(methyl methacrylate) (PMMA). These materials are particularly advantageous because they are biocompatible and corrosion resistant and accordingly can be used in a wide variety of applications. These materials are merely examples and the use of a counter-layer in the manner disclosed can be employed with any type of piezoelectric material and a wide variety of different non-piezoelectric materials for the counter-layer. Further, the first 210 and second 215 electrical contacts can comprise, for example, gold or any other conductive material that does not significantly degrade due to the stresses exerted on the beam 225.

Returning again to FIG. 2A, the beam 225 can be mechanically attached to a support 235. Further, an electrical consumer 240 can be electrically coupled to the first 210 and second 215 electrical contacts. As used herein, the term electrical consumer is intended to cover any type of device that consumes electricity, and thus includes energy storage devices, devices that use the generated electricity to power the device, as well as measurement devices that use the electricity generated due to the bending of the beam 225 to measure properties such as, pressure, displacement, fluid flow velocity, or concentration of biological specimens.

Although FIGS. 2A and 2B illustrate the beam 225 being arranged as a cantilever beam with one fixed end and one free end, the beam 225 can be employed as other types of beams, such as a clamped-clamped beam in which both ends of the beam 225 are fixed. Further, the beam 225 can be arranged as a membrane in which all sides of the beam 225 are fixed to a support.

Figure 3A:
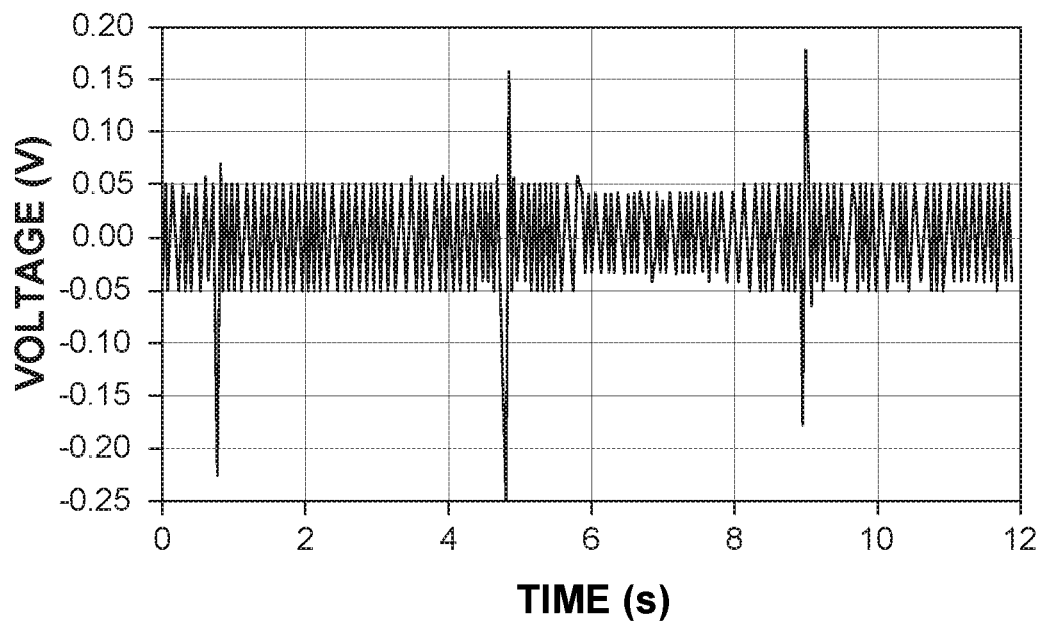
FIGS. 3A and 3B are graphs respectively illustrating the response of a piezoelectric beam and a beam comprising a piezoelectric layer and a counter-layer according to embodiments.
Figure 3B:
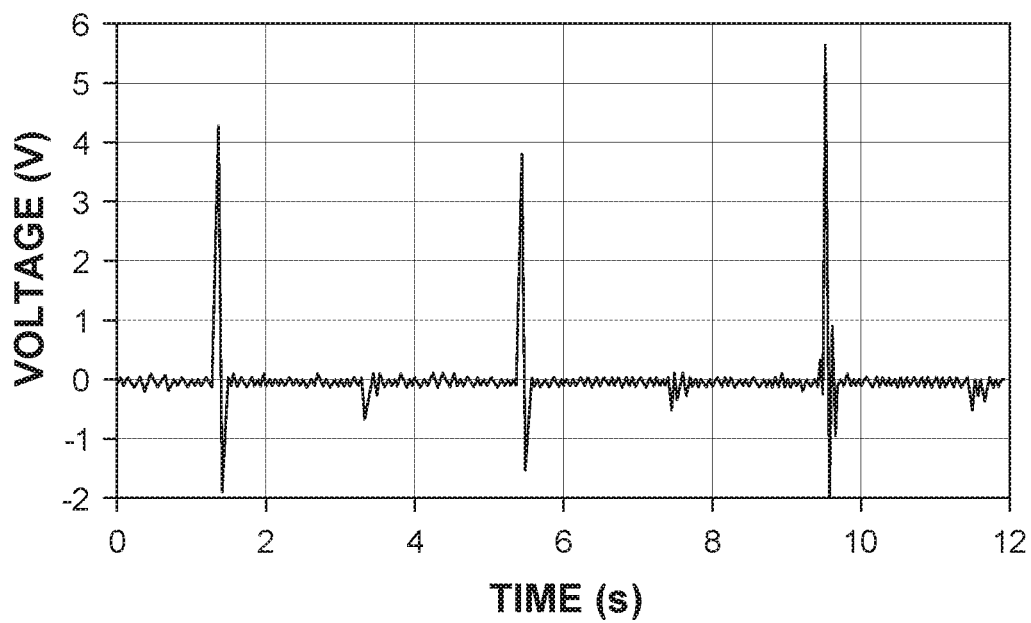

The effectiveness of the disclosed counter-layer can be appreciated by a comparison of the graphs in FIGS. 3A and 3B, which respectively illustrate the response of a piezoelectric beam and a beam comprising a piezoelectric layer and a counter-layer according to embodiments. The graph in FIG. 3A was produced by straining a 25 μm thick polyvinylidene fluoride piezoelectric layer and the graph of FIG. 3B was produced by straining a beam comprising a 25 μm thick polyvinylidene fluoride piezoelectric layer laminated with a 120 μm thick poly(methyl methacrylate) layer.

As illustrated in FIG. 3A, a piezoelectric beam by itself exhibits a very low voltage response to strain with voltage peaks between approximately 0.20 V and −0.25 V. In contrast, as illustrated in FIG. 3B, a beam having a piezoelectric layer arranged on top of a counter-layer produces voltage peaks between approximately 6.0 V and −2.0 V. Thus, the beam having a piezoelectric layer arranged on top of a counter-layer results in an 18× increase in generated voltage, which corresponds to a 324× increase in power generated by the energy generating device. Accordingly, the counter-layer, by adjusting the neutral axis of a beam having a piezoelectric layer, essentially acts as an amplifier of the piezoelectric layer.

Figure 4:
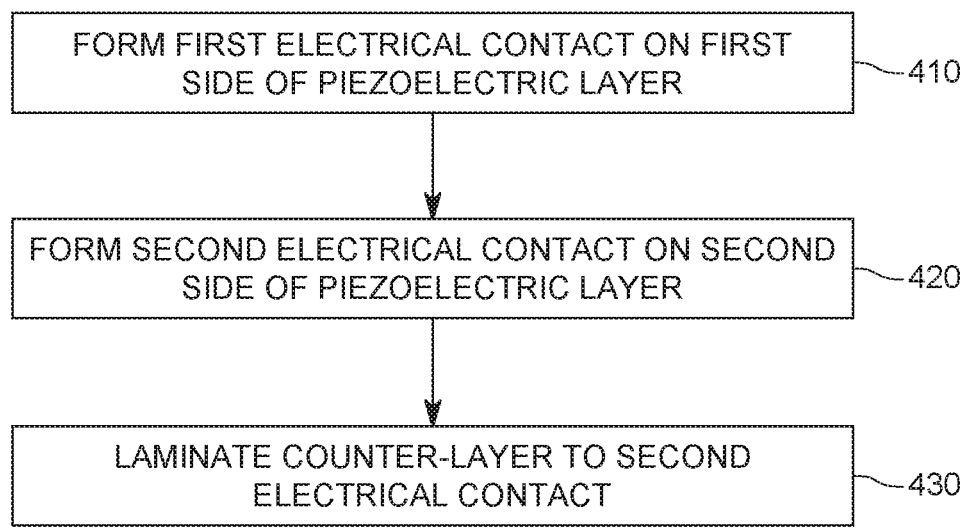
FIG. 4 is a flow diagram of a method for forming an energy generating device according to embodiments.

FIG. 4 is a flow diagram of a method for forming an energy generating device according to embodiments. Initially, a first electrical contact 210 is formed on a first side of a piezoelectric layer 205 (step 410). A second electrical contact 215 is formed on a second side of the piezoelectric layer 205 (step 420). The second side of the piezoelectric layer 205 is opposite of the first side. A counter-layer 220 is laminated to the second electrical contact 215 (step 430). The piezoelectric layer 205, first 210 and second 215 electrical contacts, and counter-layer 220 form a beam 225 having a neutral axis 230 outside of the piezoelectric layer 205. The neutral axis of the beam 225 can be at or below the second electrical contact 215, such as in the counter-layer 220.

If the beam 225 is a cantilever beam, the method can further include affixing a first end of beam 225 to a support 235 and a second end of the beam 225 is not fixed to a support. If the beam 225 is a clamped-clamped beam, both the first and second ends of the beam are fixed to supports.

Figure 5:
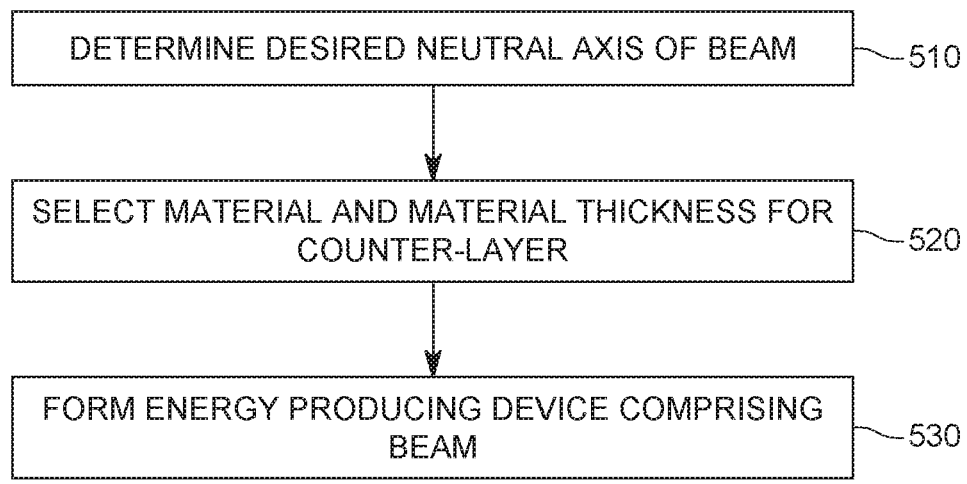
FIG. 5 is a flow diagram of a method for forming an energy generating device according to embodiments.

FIG. 5 is a flow diagram of a method for forming an energy generating device according to embodiments. Initially, a desired neutral axis 230 of a beam 225 comprising a piezoelectric layer 205 on top of a counter-layer 220 is determined (step 510). The desired neutral axis 230 is at or below an interface between the piezoelectric layer 205 and the counter-layer 220. A material for the counter-layer 220 and a thickness of the material for the counter-layer 220 are selected to achieve the desired neutral axis 230 (step 520).

Figure 6:
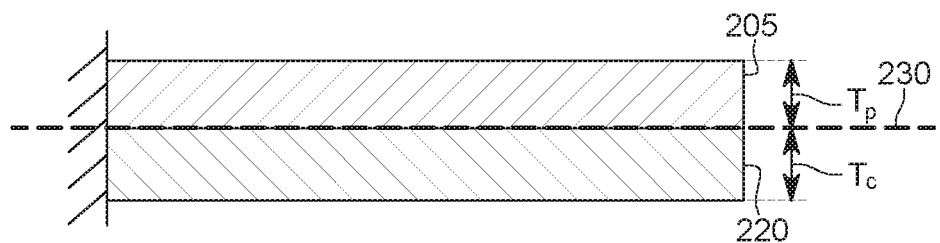
FIG. 6 is a schematic diagram of beam comprising a piezoelectric layer and a counter-layer according to embodiments.

The selection of the material and thickness of the material for the counter-layer 220 to achieve a desired neutral axis x will be described in connection with FIG. 6, where $t_p$ is the thickness of the piezoelectric layer 205, $t_c$ is the thickness of the counter-layer 220. The position of the neutral axis 220 can be determined using the following equation:

$$x = \frac{1}{2}\left(\frac{E_p t_p^2 - E_c t_c^2}{E_p t_p + E_c t_c}\right) \quad (1)$$

where $E_p$ is the Young's modulus of the piezoelectric layer 205, and $E_c$ is the Young's modulus of the counter-layer 220.

If k is the ratio of the Young's moduli of piezoelectric layer 205 and the counter-layer 220, i.e., $$k = \frac{E_p}{E_c},$$

then the equation (1) can be rewritten as $$x = \frac{1}{2}\left(\frac{k t_p^2 - t_c^2}{k t_p + t_c}\right) \quad (2)$$

If the value x of the neutral axis 230 is positive, i.e., $t_c < \sqrt{k} t_p$, then the neutral axis 230 lies within the piezoelectric layer 205, which experiences both compressive and tensile strain leading to reduced output voltage. If the value x of the neutral axis 230 is zero, i.e., $t_c = \sqrt{k} t_p$, then the neutral axis lies at the interface between the piezoelectric layer 205 and the counter-layer 220. This is the smallest value of $t_c$ for which the piezoelectric layer 205 experiences unidirectional strain.

If the value x of the neutral axis 230 is negative, i.e., $t_c > \sqrt{k} t_p$, then the neutral axis lies within the counter-layer 220 and the strain in the piezoelectric layer 205 is unidirectional. The larger the value of $t_c$, the further away the neutral axis 230 is from the piezoelectric layer 205, which leads to higher unidirectional strain and more output voltage.

Thus, by increasing the thickness of the counter-layer 220, i.e., increasing $t_c$, and/or increasing the rigidity of the counter-layer 220, i.e., selecting a material with a greater Young's modulus $E_c$, the counter-layer 220 can shift the neutral axis of the beam 225 outside of the piezoelectric layer 205 to at least the interface between the piezoelectric layer 205 and the counter-layer 220, and even into the counter-layer 220. Accordingly, in some embodiments the counter-layer 220 is more rigid than the piezoelectric layer 205.

The energy producing device 200 comprising the beam 225 can then be formed using the counter-layer 220 having the selected material and thickness so that the beam 225 of the energy producing device 200 has the desired neutral axis 230 (step 530). This can be achieved using the method described above in connection with FIG. 4.

It will be recognized that piezoelectric material is typically so thin that it is often not employed by itself for a beam but is often supported. This typically involves integrating the piezoelectric material in a support material. In contrast, the disclosed beam employs two distinct layers, a piezoelectric layer and a counter-layer that is laminated to the piezoelectric layer. Further, piezoelectric material is typically integrated into a support material to measure bending of the support material, in which case the lateral dimensions of the piezoelectric material and the support material are typically different. In contrast, in the disclosed beam the piezoelectric layer and the counter-layer have the same general lateral dimensions but generally have different thicknesses. The same general lateral dimensions should be understood as not requiring the piezoelectric layer and counter-layer to have the same exact lateral dimensions and instead these two layers can have lateral dimensions that are within ±25% of each other.

The disclosed energy producing device can be employed in any number of different applications. In one example, the energy producing device can be attached to a marine animal and the animal's movement through water can produce the beam bending force to generate electricity, which can be used to power a tracking device attached to the animal. In another example, the energy producing device can be integrated into a piece of clothing that is subject to bending, such as a shoe. Thus, walking in the shoe will produce the bending force to generate electricity. The disclosed energy producing device can also be used to scavenge ambient vibrations, such as vibrations from electrical appliances, automobile engines, etc. The term energy producing device should not be interpreted as limited to devices with the sole purpose of generating energy for storage or immediate usage, which are commonly referred to as energy harvesters. Instead, the energy produced by the disclosed device can be employed to measure pressure, displacement, fluid flow velocity, or concentration of biological specimens.

The disclosed embodiments provide a piezoelectric energy generating beam. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An energy producing device, comprising:
    a piezoelectric layer having a first side and second side opposite of the first side, the piezoelectric layer having a thickness $t_p$ and a Young's modulus $E_p$;
    a first electrical contact arranged on the first side of the piezoelectric layer;
    a second electrical contact arranged on the second side of the piezoelectric layer; and
    a counter-layer arranged on the second electrical contact and having a thickness $t_c$ and a Young's modulus $E_c$, wherein a ratio of $E_p$ and $E_c$ is k,
    wherein the piezoelectric layer, first and second electrical contacts, and counter-layer form a beam and the thicknesses $t_p$ and $t_c$ are selected so that $t_c$ is equal to or larger than a product of (1) a square root of k, and (2) the thickness $t_p$, so that a neutral axis is outside of the piezoelectric layer.

2. The energy producing device of claim 1, wherein the neutral axis of the beam is at the second electrical contact.

3. The energy producing device of claim 1, wherein the neutral axis of the beam is in the counter-layer.

4. The energy producing device of claim 1, wherein the beam is a cantilever beam.

5. The energy producing device of claim 1, wherein the beam is a clamped-clamped beam.

6. The energy producing device of claim 1, wherein the piezoelectric layer comprises polyvinylidene fluoride, PVDF.

7. The energy producing device of claim 1, wherein the counter-layer comprises poly(methyl methacrylate), PMMA.

8. The energy producing device of claim 1, further comprising:
an energy consumer electrically coupled to the first and second electrical contacts.

9. The energy producing device of claim 1, further comprising:
an energy storage device electrically coupled to the first and second electrical contacts.

10. The energy producing device of claim 1, wherein the counter-layer is more rigid than the piezoelectric layer.

11. The energy producing device of claim 1, wherein the counter-layer is a non-piezoelectric material.

12. A method for forming an energy producing device, the method comprising:
forming a first electrical contact on a first side of a piezoelectric layer, wherein the piezoelectric layer has a thickness $t_p$ and a Young's modulus $E_p$;
forming a second electrical contact on a second side of the piezoelectric layer, wherein the second side of the piezoelectric layer is opposite of the first side; and
laminating a counter-layer to the second electrical contact, wherein the counter-layer has a thickness $t_c$ and a Young's modulus $E_c$, and a ratio of $E_p$ and $E_c$ is k, and
wherein the piezoelectric layer, first and second electrical contacts, and counter-layer form a beam and the thicknesses $t_p$ and $t_c$ are selected so that $t_c$ is equal to or larger than a product of (1) a square root of k, and (2) the thickness $t_p$, so that a neutral axis is outside of the piezoelectric layer.

13. The method of claim 12, further comprising:
affixing a first end of the beam to a support, wherein a second end of the beam, which is opposite of the first end, is not fixed to a support.

14. The method of claim 12, further comprising:
affixing a first end of the beam to a first support; and
affixing a second end of the beam to a second support, wherein the second end is opposite of the first end.

15. The method of claim 12, wherein the neutral axis of the beam is at or below the second electrical contact.

16. A method for forming an energy producing device, the method comprising:
determining a desired neutral axis of a beam comprising a piezoelectric layer on top of a counter-layer, wherein the desired neutral axis is at or below an interface between the piezoelectric layer and the counter-layer, and the piezoelectric layer is selected to have a thickness $t_p$ and a Young's modulus $E_p$;
selecting a material for the counter-layer that has a Young's modulus $E_c$ and a thickness $t_c$ to achieve the desired neutral axis, wherein a ratio of $E_p$ and $E_c$ is k; and
forming the energy producing device comprising the beam with a counter-layer comprising the selected material and thickness,
wherein the beam of the energy producing device has the desired neutral axis outside the piezoelectric layer by selecting the thicknesses $t_p$ and $t_c$ so that $t_c$ is equal to or larger than a product of (1) a square root of k, and (2) the thickness $t_p$.

17. The method of claim 16, wherein the material and thickness of the counter-layer are selected based on:

$$x = \frac{1}{2}\left(\frac{E_p t_p^2 - E_c t_c^2}{E_p t_p + E_c t_c}\right)$$

wherein x is a position of the desired neutral axis.

18. The method of claim 16, wherein the formation of the energy producing device comprises:
forming a first electrical contact on a first side of the piezoelectric layer;
forming a second electrical contact on a second side of the piezoelectric layer, wherein the second side of the piezoelectric layer is opposite of the first side; and
laminating the counter-layer to the second electrical contact.

19. The method of claim 16, further comprising:
affixing at least one end of the beam to a support.

* * * * *